United States Patent
Herthan et al.

(10) Patent No.: US 9,982,473 B2
(45) Date of Patent: May 29, 2018

(54) VEHICLE HAVING AN ACTUATING APPARATUS FOR A VEHICLE DOOR, ACTUATING APPARATUS AND USE OF AN ACTUATING APPARATUS

(71) Applicant: BROSE FAHRZEUGTEILE GMBH & CO. KOMMANDITGESELLSCHAFT, HALLSTADT, Hallstadt (DE)

(72) Inventors: Bernd Herthan, Michelau (DE); Dominik Hagel, Bad Staffelstein (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 0 days. days.

(21) Appl. No.: 15/149,319

(22) Filed: May 9, 2016

(65) Prior Publication Data
US 2016/0251891 A1    Sep. 1, 2016

Related U.S. Application Data

(63) Continuation of application No. PCT/EP2014/073285, filed on Oct. 30, 2014.

(30) Foreign Application Priority Data

Nov. 8, 2013  (DE) .................. 10 2013 018 838

(51) Int. Cl.
*E05F 15/73*    (2015.01)
*B60R 25/20*    (2013.01)
(Continued)

(52) U.S. Cl.
CPC .............. *E05F 15/73* (2015.01); *B60J 5/10* (2013.01); *B60R 25/2054* (2013.01);
(Continued)

(58) Field of Classification Search
CPC ............... E05F 15/73; E05Y 2400/852; E05Y 2400/858; E05Y 2400/86; E05Y 2900/546;
(Continued)

(56) References Cited

U.S. PATENT DOCUMENTS 8,868,299 B2   10/2014  Kroemke et al.
9,205,727 B2   12/2015  Herthan
(Continued)

FOREIGN PATENT DOCUMENTS

DE    102009019673 A1   11/2010
DE    202009018205 U1    5/2011
(Continued)

*Primary Examiner* — Justin B Rephann
(74) *Attorney, Agent, or Firm* — Laurence A. Greenberg; Werner H. Stemer; Ralph E. Locher

(57) ABSTRACT

An actuating apparatus for adjusting a first vehicle door which can be automatically adjusted between a closed position and an open position is used in a vehicle. To this end, the actuating apparatus has a capacitive distance sensor for detecting a movement of a person who is in the vicinity of the vehicle, and also has a control and evaluation unit. The control and evaluation unit is configured to identify a first door actuation request on the basis of the detected movement, and to trigger adjustment of the first vehicle door when the first door actuation request is identified. In this case, a sensor electrode of the capacitive distance sensor is arranged in a vehicle corner region which is associated with the rear of the vehicle.

6 Claims, 3 Drawing Sheets

(51) Int. Cl.
  *H03K 17/955* (2006.01)
  *E05F 15/60* (2015.01)
  *B60J 5/10* (2006.01)

(52) U.S. Cl.
  CPC ............ *E05F 15/60* (2015.01); *H03K 17/955* (2013.01); *E05Y 2400/44* (2013.01); *E05Y 2900/546* (2013.01); *G07C 2209/04* (2013.01); *G07C 2209/64* (2013.01); *H03K 2217/96078* (2013.01)

(58) Field of Classification Search
  CPC .............. B60R 25/2054; H03K 17/955; H03K 2217/96078; G07C 2209/64
  See application file for complete search history.

(56) References Cited

U.S. PATENT DOCUMENTS

| | | | |
|---|---|---|---|
| 2003/0216817 A1 | 11/2003 | Pudney | |
| 2008/0068145 A1 | 3/2008 | Weghaus et al. | |
| 2011/0276234 A1* | 11/2011 | Van Gastel | E05B 81/78 701/49 |
| 2012/0319502 A1* | 12/2012 | Van Gastel | H03K 17/955 307/116 |
| 2013/0234828 A1 | 9/2013 | Holzberg et al. | |
| 2014/0032055 A1* | 1/2014 | Holzberg | B62D 25/12 701/49 |
| 2014/0039766 A1* | 2/2014 | Miyake | B60R 25/245 701/49 |
| 2014/0070920 A1* | 3/2014 | Elie | H03K 17/945 340/5.72 |
| 2014/0324273 A1* | 10/2014 | Russ | B60R 25/00 701/29.1 |
| 2015/0002175 A1 | 1/2015 | Van Gastel | |
| 2015/0012176 A1* | 1/2015 | Schindler | B60W 50/08 701/36 |
| 2015/0262436 A1* | 9/2015 | Herthan | B60R 25/2054 340/5.72 |
| 2016/0169708 A1* | 6/2016 | Sterk | H03K 17/955 324/658 |

FOREIGN PATENT DOCUMENTS

| | | |
|---|---|---|
| DE | 102010049400 A1 | 4/2012 |
| DE | 202012005255 U1 | 6/2012 |
| DE | 102011018847 A1 | 10/2012 |
| DE | 102012100960 A1 | 8/2013 |
| EP | 1902912 A1 | 3/2008 |
| JP | 2005315024 A | 11/2005 |

* cited by examiner

VEHICLE HAVING AN ACTUATING APPARATUS FOR A VEHICLE DOOR, ACTUATING APPARATUS AND USE OF AN ACTUATING APPARATUS

CROSS-REFERENCE TO RELATED APPLICATION

This is a continuation application, under 35 U.S.C. § 120, of copending international application No. PCT/EP2014/073285, filed Oct. 30, 2014, which designated the United States; this application also claims the priority, under 35 U.S.C. § 119, of German patent application No. DE 10 2013 018 838.5, filed Nov. 8, 2013; the prior applications are herewith incorporated by reference in their entirety.

BACKGROUND OF THE INVENTION

Field of the Invention

The invention relates to a vehicle having an actuating apparatus for a vehicle door which can be automatically displaced between a closed position and an open position. The invention further relates to an actuating apparatus for an automatically displaceable vehicle door. The invention also relates to the use of an actuating apparatus for an automatically displaceable vehicle door in a vehicle.

In modern vehicles, in particular passenger cars, increasing use is made of actuating apparatuses which contactlessly recognize a door opening request of a vehicle user and then automatically open the associated vehicle door. In this case, the vehicle door is often a tailgate of the vehicle, which is designed and provided for reversibly closing the trunk compartment (also referred to as a trunk door or trunk lid). The actuating apparatus in this case is configured, in particular, for recognizing the door opening request on the basis of a movement of the vehicle user. The actuating apparatus usually contains a contactless (e.g. capacitive) distance sensor for this purpose. The measured signal detected by the distance sensor is compared in a control and evaluation unit, in this case, to a stored reference signal. If the measured signal matches the reference signal to a sufficient extent, the control and evaluation unit deduces the door opening request and actuates the vehicle door to open. The advantage of such a contactless recognition of the door opening request is that the vehicle user has both hands available for carrying load objects (e.g., a beverage crate). For the purpose of recognizing the door opening request in this case, a foot movement, in particular a kick-type foot movement in the direction of the rear bumper of the vehicle is usually provided (also referred to as a "foot kick"). In order to enable this foot kick to be recognized with the least interference possible, the distance sensor is also usually disposed in the region of the bumper.

When capacitive distance sensors are used, in particular, metal objects in the close vicinity of the capacitive sensor electrode can influence the capacitive detection of a movement, however. Such metal objects are an exhaust pipe or a trailer coupling, for example. Conventionally, the sensor electrodes of the capacitive distance sensors are disposed at a sufficient distance away from such metal objects (e.g., being routed around them in a wavelike manner), and so the influence of the measured signal is negligible. In the case of production of the actuating apparatuses or the capacitive sensor electrodes that is suitable for application on a large scale, it is desirable, in particular, to allow for a preferably high number of identical parts (preferably for all equipment packages of a vehicle model). It is possible however, that the position of the exhaust pipe (or possibly multiple exhaust pipes) in a vehicle model may differ, depending on the equipment package. In addition, individual vehicles of one and the same vehicle model can be equipped with a trailer coupling. A specifically adapted sensor electrode is usually provided for each of these equipment packages.

SUMMARY OF THE INVENTION

The problem addressed by the invention is that of improving an automatic displacement of a vehicle door.

The vehicle contains a vehicle door (referred to in the following as the first vehicle door), which is automatically displaceable between a closed position and an open position, preferably by means of an assigned ("first", electromotive) servomotor. The vehicle contains an actuating apparatus for the purpose of displacing the first vehicle door. The actuating apparatus in this case contains a capacitive distance sensor for detecting a movement of a person who is in the vicinity of the vehicle. The person is preferably the vehicle user. In addition, the actuating apparatus contains a control and evaluation unit, which is configured (by circuitry or programming) for recognizing a first door actuation request on the basis of the detected movement and, upon recognition of the first door actuation request, triggering a displacement of the first vehicle door, preferably activating the first servomotor, which is provided if necessary, for the purpose of displacing the first vehicle door. In other words, the actuating apparatus displaces the first vehicle door when the vehicle user carries out the correct movement (i.e., preferably the movement corresponding to a stored reference movement). According to the invention, a sensor electrode of the capacitive distance sensor is disposed in a vehicle corner region of the rear of the vehicle in this case.

Here and in the following, "automatic displacement" is considered to mean that the first vehicle door is moved, in particular, without human, manual intervention. For this purpose, it is conceivable, in principle, within the scope of the invention that the vehicle contains a spring drive or a pneumatic drive for the purpose of the automatic displacement. For the case, in particular, in which the vehicle contains the spring drive for the purpose of displacement, it is conceivable within the scope of the invention that the spring drive moves the first vehicle door only slightly out of the closed position, in which the first vehicle door sealingly rests against a closing edge of the stationary vehicle body. In this case, the open position of the first vehicle door corresponds, for example, to a position in which the first vehicle door opens only slightly, i.e., is swiveled out of the door lock and rests against the door seal. Preferably, however, the displacement of the first vehicle door is carried out by the first servomotor. Preferably, the first vehicle door is also disposed in the open position in such a way—for example, swiveled through approximately 45°-90° with respect to the closed position, that the inner space of the vehicle is accessible.

Here and in the following, "vehicle corner region" is considered to mean a region which extends approximately 50 cm from the corner of the vehicle in the vehicle longitudinal direction and in the vehicle transverse direction. Preferably, in this case, the sensor electrode is disposed in a region of the vehicle facing the ground, in particular in a bumper attached at the rear of the vehicle. This is advantageous, in particular, since the control and evaluation unit preferably detects a foot movement—in particular a kick movement or a "foot kick"—of the vehicle user, and utilizes this to recognize the first door actuation request. The sensor electrode is therefore disposed in a region in which the expected movement can be detected at a preferably short distance and virtually free from obstructions.

The first vehicle door is also preferably a tailgate (also: trunk door, trunk lid) provided for reversibly closing the trunk compartment of the vehicle. As is known, when loading or unloading the trunk compartment, in particular, the vehicle user often uses both hands for carrying load objects and therefore does not have a free hand for operating the tailgate. As a result of the recognition of the door actuation request on the basis of the foot movement, the vehicle user therefore does not need to set down the load objects in order to displace the first vehicle door (in particular the tailgate), in particular in order to open the door.

The arrangement of the sensor electrode in the vehicle corner region has the advantage, in this case, that metal objects (such as, for example, exhaust pipes or a trailer coupling) which influence the capacitive distance measurement (i.e., the detection of the foot movement) are typically not disposed there. Therefore, one and the same design of the sensor electrode can be used for this vehicle, in particular for this vehicle model, preferably including all equipment packages, and therefore the production costs are reduced as a result of a high number of identical parts. In addition, this arrangement has the advantage that the sensor electrode is disposed substantially next to the first vehicle door and, therefore, the vehicle user is also situated laterally next to, in particular (at least almost) outside the swivel range of the first vehicle door when issuing his (first) door actuation request. The vehicle user therefore does not need to get out of the way—or only slightly so—of the moving first vehicle door in order to avoid a collision with the first vehicle door.

In principle, it is possible within the scope of the invention that the sensor electrode is alternatively disposed at one of the two vehicle corner regions of the vehicle rear (in particular when the first vehicle door is the tailgate—otherwise the sensor electrode is preferably disposed in the vehicle corner region adjoining the corresponding vehicle side door). Likewise, it is also conceivable within the scope of the invention that the actuating apparatus (provided for the displacement of the tailgate) contains two distance sensors, which are separate from one another, the sensor electrodes of which are each disposed in a vehicle corner region. In a preferred embodiment—and for the case, in particular, in which the first vehicle door is the tailgate—the sensor electrode is disposed on a vehicle side opposite the position of the steering wheel. In other words, the sensor electrode is located in the right rear vehicle corner region when the steering wheel is disposed on the left side of the vehicle (i.e., the vehicle is designed as a left-hand drive vehicle). In the case of a vehicle configured as a right-hand drive vehicle, the sensor electrode is therefore preferably located, in a reversed manner, in the left rear vehicle corner region. As a result, the safety for the vehicle user is advantageously increased when the vehicle is (properly) parked parallel to the road, at the edge of the road. In this case, the sensor electrode is therefore typically disposed in the vehicle corner region facing away from the roadway. Therefore, the vehicle user can issue the door actuation request by the proper movement, for example, from the sidewalk and without the need to step onto the roadway.

Within the scope of the invention it is also conceivable that the sensor electrode is oriented transversely to the longitudinal direction of the vehicle. Alternatively, the sensor electrode is advantageously oriented parallel to the longitudinal direction of the vehicle, i.e., the sensor electrode is disposed in the particular vehicle corner region along the longitudinal side of the vehicle. In this case, it is particularly easy to issue the first door actuation request from the sidewalk. In a particularly preferred embodiment, the sensor electrode is curved around the vehicle corner of the vehicle corner region, however. As a result, the detection range of the sensor electrode is advantageously enlarged, and therefore the vehicle user, when issuing the first door actuation request, can stand either behind the vehicle or laterally next to the vehicle.

In another advantageous embodiment, the actuating apparatus is designed and provided for activating not only the first vehicle door but also a second vehicle door of the vehicle, which is advantageously automatically displaceable, in particular by means of a second servomotor, between an associated open position and a closed position. In this case, the control and evaluation unit of the actuating apparatus is designed, in particular, for recognizing a second door actuation request on the basis of the detected movement and, upon recognition of the second door actuation request, triggering the displacement of the second vehicle door, preferably, i.e., activating the second servomotor for the purpose of displacement. The second vehicle door is preferably a (vehicle) side door, in particular a sliding door.

The control and evaluation unit, for the purpose of recognizing the first door actuation request, is preferably designed for utilizing a signal from the distance sensor, which is characteristic for a simple kick movement (i.e., a single foot kick) in the direction of the sensor electrode (in particular in the direction of the bumper). In particular in the case in which the actuating apparatus is configured for activating two automatically displaceable vehicle doors, it is provided that the control and evaluation unit, for the purpose of recognizing the second door actuation request, preferably utilizes a signal which is characteristic for a multiple, in particular, double foot kick.

The actuating apparatus according to the invention for a first vehicle door, which is automatically displaceable between the closed position and the open position, preferably by the first servomotor, contains a capacitive distance sensor. This distance sensor is configured and provided for detecting a movement of a person who is in the vicinity of the vehicle. In addition, the actuating apparatus contains a control and evaluation unit, which is configured (by circuitry or programming) for recognizing a first door actuation request on the basis of the detected movement and, upon recognition of the first door actuation request, triggering the displacement of the first vehicle door, preferably activating the first servomotor for the purpose of displacing the first vehicle door. The capacitive distance sensor also contains a sensor electrode which, according to the invention, is configured for installation in a vehicle corner region which is associated with the rear of the vehicle. The actuating apparatus preferably contains an adapter for this purpose, which is preformed for installation in the vehicle corner region and on which the sensor electrode of the distance sensor is held.

In a preferred embodiment, the sensor electrode is configured to be disposed, in the proper final installation position on the vehicle, in particular on a vehicle side opposite the steering wheel position of the vehicle.

In an additional or alternative embodiment, the sensor electrode is preferably configured to be disposed, in the proper final installation position on the vehicle, so as to be curved around the vehicle corner of the vehicle corner region.

In another advantageous embodiment, the actuating apparatus is configured for activating an additional (second), automatically displaceable vehicle door, in particular a second servomotor associated with this second vehicle door. In this case, the control and evaluation unit of the actuating apparatus is configured, in particular, for recognizing a second door actuation request on the basis of the detected movement and, upon recognition of the second door actuation request, triggering the displacement of the second vehicle door, i.e., in particular, activating the second servomotor.

According to the invention, the actuating apparatus is utilized in a vehicle. In this case, the actuating apparatus is configured and provided for displacing a first vehicle door, which is automatically displaceable between a closed position and an open position, preferably by a first servomotor. To this end, the actuating apparatus has a capacitive distance sensor for detecting a movement of a person who is in the vicinity of the vehicle, and also has a control and evaluation unit. In this case, the control and evaluation unit is configured (by circuitry or programming) for recognizing a first door actuation request on the basis of the detected movement and, upon recognition of the first door actuation request, triggering the displacement of the first vehicle door, in particular activating the first servomotor for the purpose of displacing the first vehicle door. According to the invention, a sensor electrode of the capacitive distance sensor is disposed in a vehicle corner region associated with the rear of the vehicle in this case.

In one advantageous embodiment, the actuating apparatus is utilized in such a way that the sensor electrode is disposed, in particular, on a vehicle side opposite the steering wheel position of the vehicle.

In another advantageous embodiment, the actuating apparatus is utilized in such a way that the sensor electrode is curved around the vehicle corner of the vehicle corner region.

In an additional or optional, advantageous embodiment, the actuating apparatus is utilized for displacing not only the first vehicle door but also a second, automatically displaceable vehicle door. In this case, the control and evaluation unit is configured for recognizing a second door actuation request, which is directed to the second vehicle door, on the basis of the detected movement and, upon recognition of the second door actuation request, triggering the displacement of the second vehicle door, in particular activating a servomotor associated with the second vehicle door (referred to as the second servomotor).

Other features which are considered as characteristic for the invention are set forth in the appended claims.

Although the invention is illustrated and described herein as embodied in a vehicle having an actuating apparatus for a vehicle door, an actuating apparatus and use of an actuating apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Parts that are the same are always labeled using the same reference numbers in all the figures.

Figure 1:
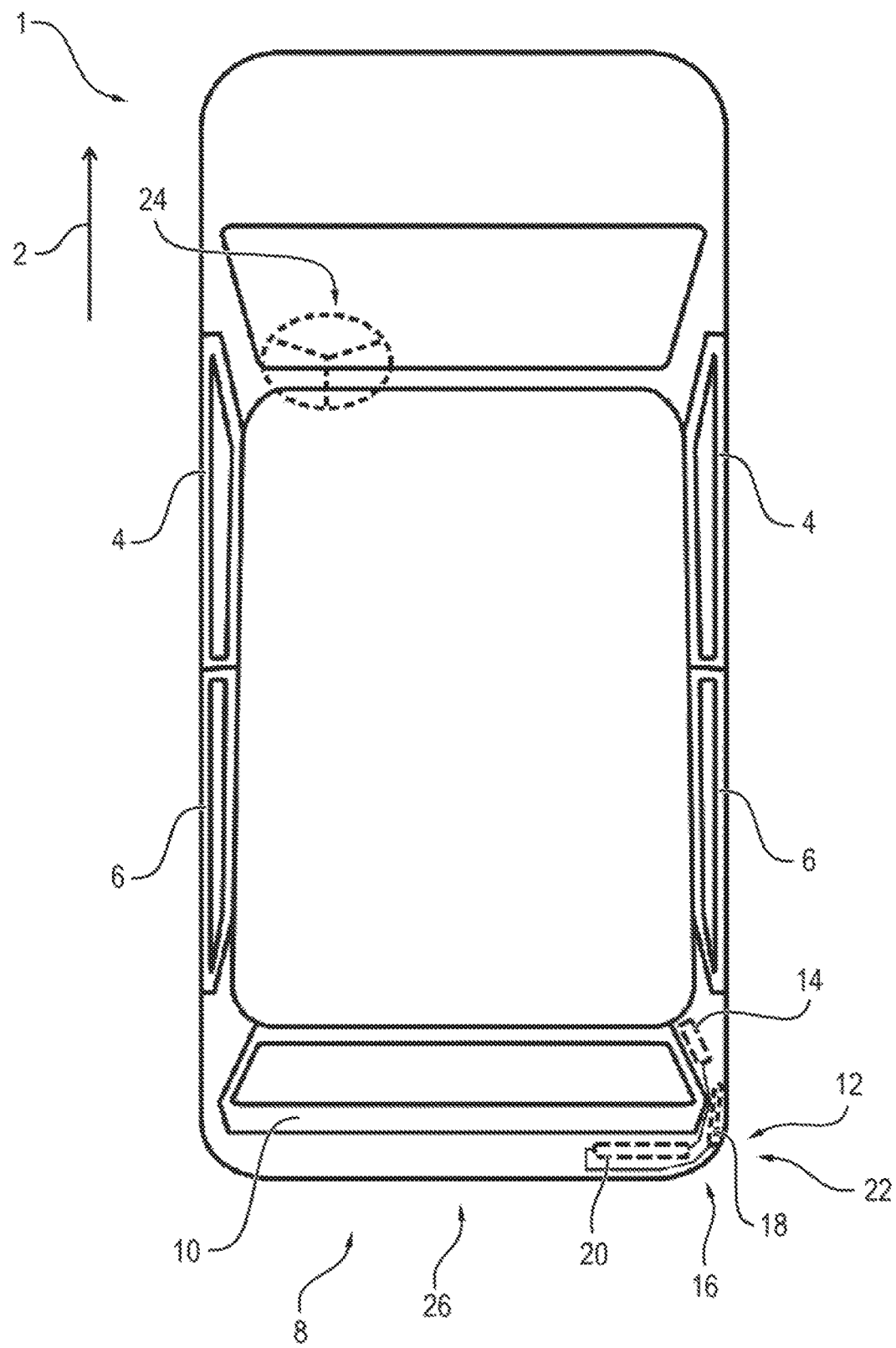
FIG. 1 is a diagrammatic, top view of a vehicle having an actuating apparatus for a vehicle door according to the invention.

Referring now to the figures of the drawings in detail and first, particularly to FIG. 1 thereof, there is shown a vehicle 1 which, viewed looking in a direction of travel 2 (forward driving), contains two vehicle doors referred to as front side doors 4 and two vehicle doors referred to as rear side doors 6. Moreover, the vehicle 1 contains another vehicle door, which is disposed at a rear 8 and is referred to as a tailgate 10. In addition, the vehicle 1 contains an actuating apparatus 12 and a servomotor 14, which is coupled to the tailgate 10 so as to transmit force. The tailgate 10 is therefore configured to be automatically opened and closed, i.e., displaced between an open position and a closed position.

The actuating apparatus 12 in this case is configured and provided for contactlessly deducing a door actuation request from a person, specifically the vehicle user and, upon recognition of the door actuation request, therefore displacing the tailgate 10. For this purpose, the actuating apparatus 12 contains a capacitive distance sensor 16 having a sensor electrode 18. The distance sensor 16 is configured for detecting an approach and, therefore, the movement of the vehicle user by a (capacitance) measurement relative to ground. For this purpose, the sensor electrode 18, together with a nearest grounded object (the vehicle user), forms a sensor capacitor having a sensor capacitance. The detected values of the sensor capacitance (or a measure of this sensor capacitance such as, e.g., a displacement current) are fed to a control and evaluation unit 20 of the actuating apparatus 12. The control and evaluation unit is configured for recognizing the movement and, on the basis thereof, the door actuation request of the vehicle user on the basis of the changes in the values of the sensor capacitance. Specifically, in this case, the control and evaluation unit 20 compares the detected change in the values of the sensor capacitance to a stored reference curve, which is characteristic for a predefined movement sequence. If there is a sufficient match, i.e., if the change in the values of the sensor capacitance is within a predefined tolerance with respect to the reference curve, the control and evaluation unit 20 deduces the presence of the door actuation request. After that, the control and evaluation unit 20 activates the servomotor 14 for the purpose of displacing the tailgate 10.

In the installed state shown, the sensor electrode 18 is oriented parallel to the direction of travel 2 and is disposed in a vehicle corner region, specifically in the right rear (vehicle) corner 22 of the vehicle 1. The sensor electrode 18 is therefore disposed on the side of the vehicle 1 opposite a steering wheel 24. As a result, the sensor electrode 18 and, therefore, also the measurement range of the distance sensor 16, within which the vehicle user issues his door actuation request, is oriented toward the side of the vehicle 1 facing away from traffic, provided the vehicle 1 is parked properly and parallel to the roadway. The vehicle user is therefore protected against the traffic on the roadway.

Moreover, the sensor electrode 18 is disposed in a bumper 26, which covers the rear 8 of the vehicle 1. This is advantageous since a kick movement in the direction of the sensor electrode 18 is utilized as the movement for the door actuation request. The kick movement is a movement of the foot according to the arrow 28 (illustrated in FIG. 2 by way of example), which movement extends toward and away from the distance sensor 16.

Figure 2:
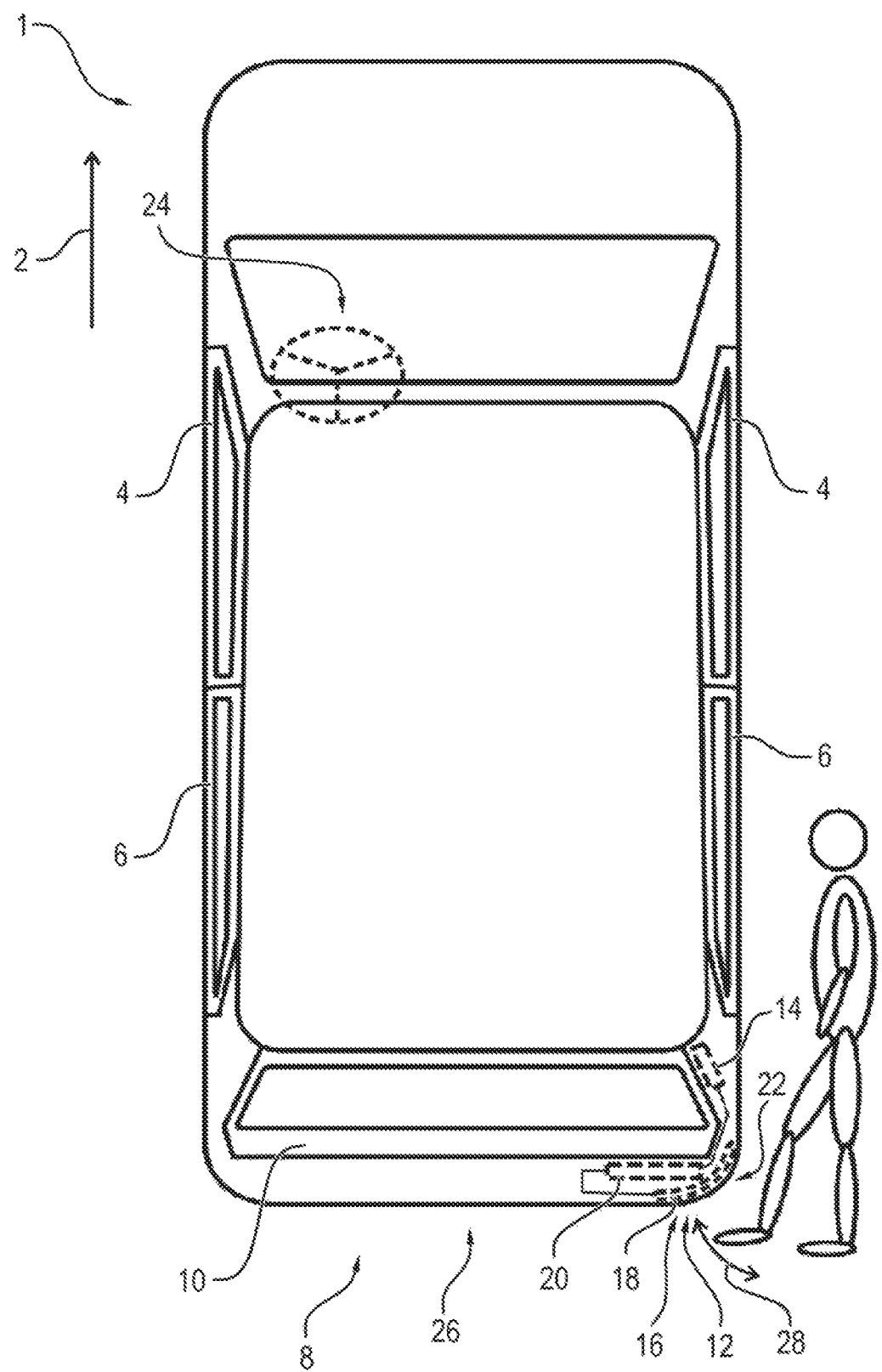
FIGS. 2 and 3 are top views showing a view according to FIG. 1 of further exemplary embodiments of the actuating apparatus.

In an alternative exemplary embodiment according to FIG. 2, the sensor electrode 18 is curved around the corner 22 of the vehicle 1. The kick movement of the vehicle user indicated by the arrow 28 can therefore be carried out in the region of the corner 22 behind the vehicle 1 or laterally next to the vehicle 1. The detection range of the sensor electrode 18 is therefore enlarged.

Figure 3:
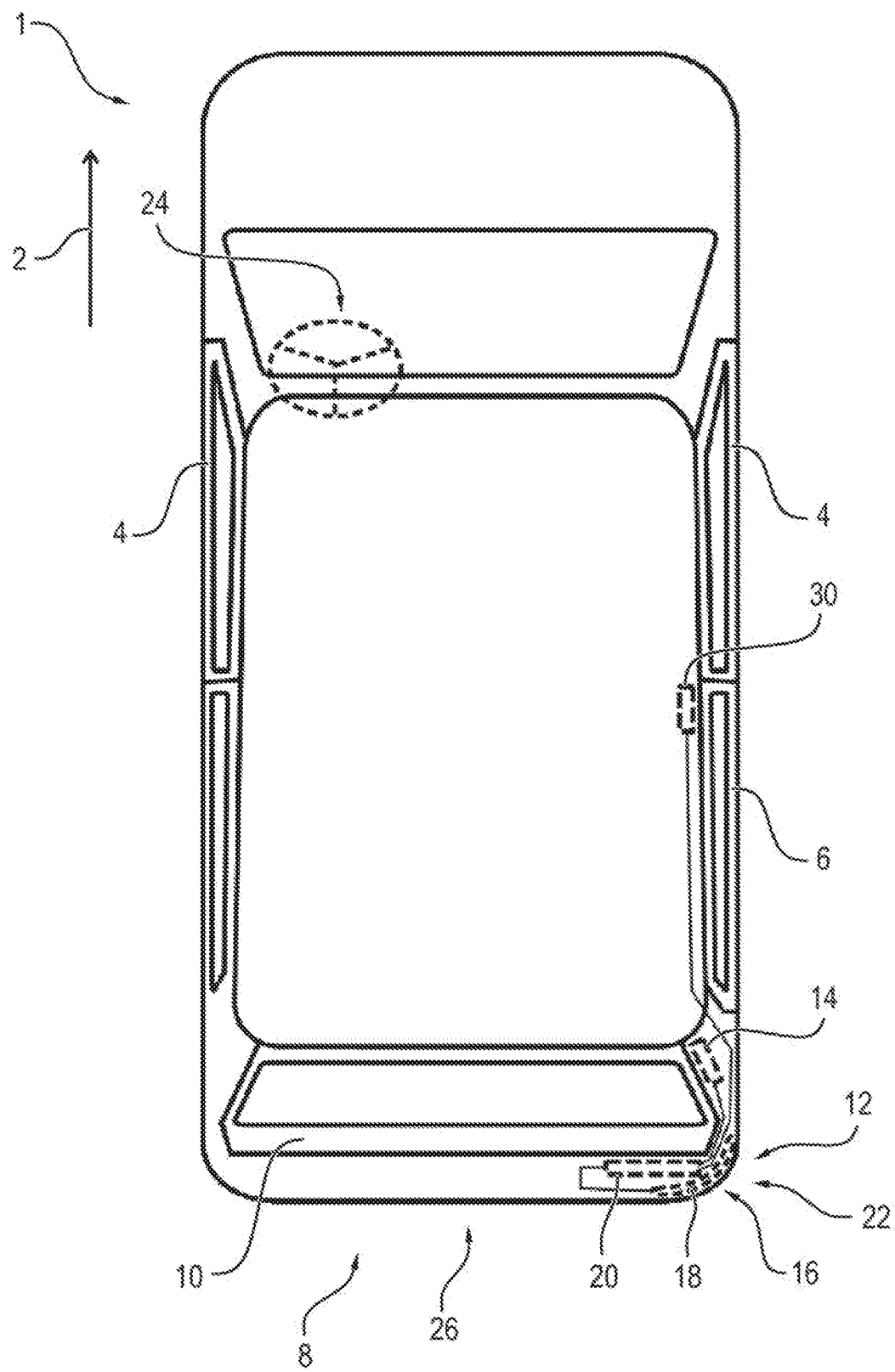

In another exemplary embodiment according to FIG. 3, the vehicle 1 contains only one rear side door 6 disposed on the right side of the vehicle. This side door 6 is designed as a sliding door in this case, which can be automatically opened and closed by a second servomotor 30. In this exemplary embodiment, the actuating apparatus 12 is configured for displacing not only the tailgate 10 but also the side door 6. The tailgate 10, therefore, is a first vehicle door, and the side door 6 is a second vehicle door, the assigned (first or second) servomotor 14 or 30, respectively, of which is activated by the actuating apparatus 12. The control and evaluation unit 20 of the actuating apparatus 12 is configured, in this case, for distinguishing—on the basis of the foot movement of the vehicle user—a first door actuation request directed to the displacement of the tailgate 10 from a second door actuation request directed to the displacement of the side door 6. Specifically, a simple kick movement according to the arrow 28 in the direction of the distance sensor 16 is interpreted to be a "tailgate-door actuation request" (first door actuation request). A double kick movement (i.e., two successive kick movements) is interpreted to be a "side door-door actuation request" (second door actuation request). If a control and evaluation unit 20 recognizes the double kick movement, it then activates the second servomotor 30 for the purpose of displacing the side door 6.

The object of the invention is not limited to the above-described exemplary embodiments. Rather, further embodiments of the invention can be derived from the above description by a person skilled in the art. In particular, the individual features of the invention, which are described on the basis of the different exemplary embodiments, and their variant configurations can also be combined with one another in another manner.

The following is a summary list of reference numerals and the corresponding structure used in the above description of the invention:
1 vehicle
2 direction of travel
4 side door
6 side door
8 rear
10 tailgate
12 actuating apparatus
14 servomotor
16 distance sensor
18 sensor electrode
20 control and evaluation unit
22 (vehicle) corner
24 steering wheel
26 bumper
28 arrow
30 servomotor

The invention claimed is:

1. A vehicle, comprising:
a first vehicle door being automatically displaceable between a closed position and an open position;
a second vehicle door;
an actuating apparatus for said first vehicle door, said actuating apparatus having a capacitive distance sensor with a sensor electrode for detecting a movement of a person who is in a vicinity of the vehicle, said sensor electrode disposed only in a vehicle corner region associated with a rear of the vehicle and being curved around a vehicle corner of said vehicle corner region; and
a control and evaluation unit configured for recognizing a first door actuation request on a basis of a detected movement and triggering a displacement of said first vehicle door upon recognition of the first door actuation request, said control and evaluation unit being configured for recognizing a second door actuation request on a basis of the detected movement and triggering a displacement of said second vehicle door upon recognition of the second door actuation request.

2. The vehicle according to claim 1, further comprising a steering wheel, said sensor electrode is disposed on a vehicle side opposite a position of said steering wheel.

3. A vehicle, comprising:
a first vehicle door being automatically displaceable between a closed position and an open position;
a second vehicle door;
an actuating apparatus for said first vehicle door, said actuating apparatus having a capacitive distance sensor with a sensor electrode for detecting a movement of a person who is in a vicinity of the vehicle, said sensor electrode disposed in a vehicle corner region associated with a rear of the vehicle and being curved around a vehicle corner of said vehicle corner region; and
a control and evaluation unit configured for recognizing a first door actuation request on a basis of a detected movement and triggering a displacement of said first vehicle door upon recognition of the first door actuation request, said control and evaluation unit being configured for recognizing a second door actuation request on a basis of the detected movement and triggering a displacement of said second vehicle door upon recognition of the second door actuation request.

4. A vehicle, comprising:
a first vehicle door being automatically displaceable between a closed position and an open position;
a second vehicle door;
an actuating apparatus for said first vehicle door, said actuating apparatus having a capacitive distance sensor with a sensor electrode for detecting a movement of a person who is in a vicinity of the vehicle, said sensor electrode disposed in a vehicle corner region associated with a rear of the vehicle, said sensor electrode being curved around a vehicle corner of said vehicle corner region from a position being 50 cm from said vehicle corner in a transverse direction of the vehicle to a position being 50 cm from said vehicle corner in a longitudinal direction of the vehicle; and
a control and evaluation unit configured for recognizing a first door actuation request on a basis of a detected movement and triggering a displacement of said first vehicle door upon recognition of the first door actuation request, said control and evaluation unit being configured for recognizing a second door actuation request on a basis of the detected movement and triggering a displacement of said second vehicle door upon recognition of the second door actuation request.

5. The vehicle according to claim 4, wherein said sensor electrode is not disposed in a middle region of a rear bumper of the vehicle.

6. The vehicle according to claim 5, wherein said middle region begins 50 cm from said vehicle corner.

* * * * *